US009376533B2

(12) United States Patent
Fabretto et al.

(10) Patent No.: US 9,376,533 B2
(45) Date of Patent: Jun. 28, 2016

(54) STRUCTURE DIRECTED VAPOUR PHASE POLYMERISATION OF CONDUCTIVE POLYMERS

(71) Applicants: Manrico Fabretto, Warradale (AU); Drew Raymond Evans, Mawson Lakes (AU); Michael Muller, Zurich (CH)

(72) Inventors: Manrico Fabretto, Warradale (AU); Drew Raymond Evans, Mawson Lakes (AU); Michael Muller, Zurich (CH)

(73) Assignee: University of South Australia, Adelaide (AU)

( * ) Notice: Subject to any disclaimer, the term of this patent is extended or adjusted under 35 U.S.C. 154(b) by 0 days.

(21) Appl. No.: 14/350,613

(22) PCT Filed: Oct. 9, 2012

(86) PCT No.: PCT/AU2012/001217
§ 371 (c)(1),
(2) Date: Apr. 9, 2014

(87) PCT Pub. No.: WO2013/052993
PCT Pub. Date: Apr. 18, 2013

(65) Prior Publication Data
US 2014/0288252 A1    Sep. 25, 2014

(30) Foreign Application Priority Data

Oct. 10, 2011 (AU) .............................. 2011904163

(51) Int. Cl.
*C08G 75/00* (2006.01)
*C08G 75/12* (2016.01)
*C08G 61/12* (2006.01)
(Continued)

(52) U.S. Cl.
CPC .............. *C08G 75/12* (2013.01); *C08G 61/126* (2013.01); *C08L 71/02* (2013.01); *C09D 165/00* (2013.01); *C09D 171/02* (2013.01);
*C08G 2261/1424* (2013.01); *C08G 2261/3223* (2013.01); *C08G 2261/91* (2013.01); *C08G 2261/92* (2013.01);
(Continued)

(58) Field of Classification Search
CPC ..................... C08G 61/126; C08G 2261/3223; C08G 2261/91; C08G 2261/92; C08G 2261/95
USPC ................................. 528/377, 378, 370, 380
See application file for complete search history.

(56) References Cited

U.S. PATENT DOCUMENTS

2010/0163808 A1* 7/2010 Chen et al. .................... 252/500

FOREIGN PATENT DOCUMENTS

EP    2 123 731    11/2009

OTHER PUBLICATIONS

Fabretto, et al., J Mater. Chem., "The role of water in the synthesis and performance of vapour phase polymerised PEDOT electrochromic devices," 2009; 19: 7871-7878.
(Continued)

*Primary Examiner* — Shane Fang
(74) *Attorney, Agent, or Firm* — Klauber & Jackson LLC

(57) ABSTRACT

The invention provides a process for producing a conductive polymer, the process comprising: providing a substrate having an oxidant layer on a surface thereof, the oxidant layer containing an oxidant, a solvent or blend of solvents, and a relatively high molecular weight non-ionic surfactant; exposing the surface containing the oxidant layer to a vapor containing an aryl or heteroaryl monomer that is polymerizable to form a conductive polymer without exposing the oxidant layer to an external source of water vapor; and polymerizing the aryl or heteroaryl monomer to form a polyaryl or polyheteroaryl conductive polymer on the surface of the substrate.

8 Claims, 4 Drawing Sheets

(51) Int. Cl.
*C09D 171/02* (2006.01)
*C08L 71/02* (2006.01)
*C09D 165/00* (2006.01)
*H01L 51/00* (2006.01)

(52) U.S. Cl.
CPC ......... *C08G 2261/95* (2013.01); *H01L 51/0037* (2013.01)

(56) References Cited

OTHER PUBLICATIONS

Fabretto, et al., Macromol. Rapid Commun., "Influence of PEG-ran-PPG Surfactant on Vapour Phase Polymerised PEDOT Thin Films," 2009; 30: 1846-1851.

Fabretto, et al., Thin Solid Films, "Vacuum vapour phase polymerised poly(3,4-ethyelendioxythiophene) thin films for use in large-scale electrochromic devices," 2011; 519: 2544-2549.

\* cited by examiner

STRUCTURE DIRECTED VAPOUR PHASE POLYMERISATION OF CONDUCTIVE POLYMERS

CROSS REFERENCE TO RELATED APPLICATIONS

This application is the National Stage of International Application No. PCT/AU2012/001217, filed Oct. 9, 2012, which claims the benefit of priority to Australian Application No. 2011904163, filed Oct. 10, 2011, the disclosures of which are herein incorporated by reference in their entireties. Applicant claims the benefits of 35 U.S.C. §120 as to the PCT application and the Australian application.

TECHNICAL FIELD

The present invention relates to processes for the production of conductive polymers and to the production of articles having a conductive polymer surface.

BACKGROUND

Inherently conductive polymers ("ICPs" or "conductive polymers") are polymers that conduct electricity. Examples of conductive polymers include electroactive polymers that exhibit a change in a physical property when stimulated by an electric current. Electrochromic polymers are an example of electroactive polymers that are commonly used in windows, mirrors and displays. Conductive polymers have been used in antistatic materials, displays, batteries, photovoltaic devices, printing electronic circuits, organic light-emitting diodes (OLEDs), organic transistors (OFETs), actuators, electrochromic applications such as windows, mirrors and displays, supercapacitors, biosensors, flexible transparent displays, electromagnetic shielding, and as a replacement for the transparent conductor indium tin oxide.

Conductive polymer films can be prepared by dissolving organic polymers in a solvent, casting or coating the resulting solution onto a substrate, and removing the solvent to form a substrate having the conductive polymer on the surface of the substrate. An example of a conductive polymer is polyaniline which can be formed either by the electrochemical or chemical oxidation of aniline.

Among the different conductive polymers used in practical applications, poly(3,4-ethylenedioxythiophene) (PEDOT) is a relatively stable inherently conductive polymer. PEDOT can be formed by oxidatively polymerizing 3,4-ethylenedioxythiophene (EDOT) monomer by wet chemical polymerization, electrochemical polymerization, chemical vapour deposition or vapour phase polymerization. A common method for obtaining PEDOT films is to polymerize EDOT via wet chemical oxidation and then apply the polymer to a substrate using a suitable coating process, such as dip coating, spin coating, printing, spray coating, etc.

Electrochemical polymerization, can also be used to deposit PEDOT films on substrates. Thus, EDOT monomer can be coated onto a conductive substrate and the sample placed into a three electrode cell with an electrolyte. A periodic voltage can be cycled across the cell, with each cycle increasing the amount of PEDOT deposited on the substrate. After 20-40 cycles film growth is generally finished. Whilst the PEDOT films formed using this method are generally high in quality, the deposition technique only allows for PEDOT films to be formed on conductive substrates and the technique is not well suited to large scale and/or commercial applications.

PEDOT films have also been formed on substrates by vapour phase polymerization of EDOT. In this method, a substrate is coated with an oxidant and the oxidant coated substrate is placed in to a chamber containing EDOT monomer in the vapour phase. Under appropriate conditions the monomer condenses on the substrate and polymerizes, creating a highly conductive and homogenous PEDOT film.

We have previously developed a process for producing an electrochromic substrate by vapour phase polymerisation of PEDOT (see WO 2009/117761, the contents of which are incorporated herein in their entirety). However, we have found that there are processing difficulties associated with prior art methods for the vapour phase polymerisation of PEDOT. In particular, the conductivity of the PEDOT polymers formed was found to be highly dependent on the deposition conditions. For example, the methods disclosed in WO 2009/117761 require the addition of water in vapour form during the polymerisation process.

There is a need for processes for producing conductive polymer films that have improved conductivity over prior art conductive polymer films. Alternatively, or in addition, there is a need for processes for producing conductive polymer films that overcome one or more of the problems associated with prior art processes.

SUMMARY

The present invention arises from our research into conditions and additives that can be used to produce PEDOT polymer films having commercially acceptable conductivity. In particular, we have found that by incorporating a relatively high molecular weight non-ionic surfactant and a solvent or blend of solvents into the oxidant layer prior to vapour phase polymerisation of PEDOT, it is possible to produce PEDOT films with conductivities above 3000 S/cm.

In a first aspect, the present invention provides a process for producing a conductive polymer, the process comprising: providing a substrate having an oxidant layer on a surface thereof, the oxidant layer containing an oxidant, a solvent or blend of solvents, and a relatively high molecular weight non-ionic surfactant; exposing the surface containing the oxidant layer to a vapour containing an aryl or heteroaryl monomer that is polymerisable to form a conductive polymer without exposing the oxidant layer to an external source of water vapour; and polymerising the aryl or heteroaryl monomer to form a polyaryl or polyheteroaryl conductive polymer on the surface of the substrate.

In a second aspect, the present invention provides a process for producing a conductive polymer, the process comprising: providing a substrate having an oxidant layer on a surface thereof, the oxidant layer containing an oxidant comprising a metal ion, a solvent or blend of solvents, and a relatively high molecular weight non-ionic surfactant capable of binding to the metal ion of the oxidant to release bound water from the oxidant; exposing the surface containing the oxidant layer to a vapour containing an aryl or heteroaryl monomer that is polymerisable to form a conductive polymer without exposing the oxidant layer to an external source of water vapour; and polymerising the aryl or heteroaryl monomer to form a polyaryl or polyheteroaryl conductive polymer on the surface of the substrate.

In a third aspect, the present invention provides a process for producing a conductive polymer, the process comprising: providing a substrate having an oxidant layer on a surface thereof, the oxidant layer containing an oxidant, a solvent or blend of solvents, and a relatively high molecular weight non-ionic surfactant; exposing the surface containing the oxidant layer to a vapour consisting essentially of an aryl or heteroaryl monomer that is polymerisable to form a conductive polymer; and polymerising the aryl or heteroaryl monomer to form a polyaryl or polyheteroaryl conductive polymer on the surface of the substrate.

In a fourth aspect, the present invention provides a process for producing a conductive polymer, the process comprising: providing a substrate having an oxidant layer on a surface thereof, the oxidant layer containing an oxidant, a solvent or blend of solvents, and a relatively high molecular weight non-ionic surfactant, wherein the solvent or blend of solvents and the relatively high molecular weight non-ionic surfactant template the formation of the conductive polymer to a flat, lamellar form; exposing the surface containing the oxidant layer to a vapour consisting essentially of an aryl or heteroaryl monomer that is polymerisable to form a conductive polymer; and polymerising the aryl or heteroaryl monomer to form a polyaryl or polyheteroaryl conductive polymer on the surface of the substrate.

In embodiments, the oxidant layer also comprises a relatively low molecular weight non-ionic or ionic hydrotrope.

In embodiments, the molecular weight of the relatively high molecular weight non-ionic surfactant is equal to or greater than about 1000. In embodiments, the molecular weight of the relatively high molecular weight non-ionic surfactant is from about 1000 to about 10000. In embodiments, the molecular weight of the relatively high molecular weight non-ionic surfactant is from about 1000 to about 9000. In embodiments, the molecular weight of the relatively high molecular weight non-ionic surfactant is from about 1000 to about 8000. In embodiments, the molecular weight of the relatively high molecular weight non-ionic surfactant is from about 1000 to about 7000. In embodiments, the molecular weight of the relatively high molecular weight non-ionic surfactant is from about 1000 to about 6000. In embodiments, the molecular weight of the relatively high molecular weight non-ionic surfactant is from about 1000 to about 5800. In embodiments, the molecular weight of the relatively high molecular weight non-ionic surfactant is from about 1100 to about 5800.

In embodiments, the relatively high molecular weight non-ionic surfactant is a glycol based copolymer. In embodiments, the relatively high molecular weight non-ionic surfactant is a triblock copolymer. In specific embodiments the triblock copolymer is selected from the group consisting of: a poly(ethylene glycol)-poly(propylene glycol)-poly(ethylene glycol) (PEG-PPG-PEG) triblock polymer and a poly(propylene glycol)-poly(ethylene glycol)-poly(propylene glycol) (PPG-PEG-PPG) triblock polymer.

In embodiments, the relatively low molecular weight non-ionic or ionic hydrotrope has a molecular weight of equal to or less than about 200. In embodiments, the relatively low molecular weight non-ionic or ionic hydrotrope has a dielectric constant that is greater than about 15 at 20° C. In embodiments, the relatively low molecular weight non-ionic or ionic hydrotrope is an alkylene glycol, such as ethylene glycol, diethylene glycol and triethylene glycol.

In a fifth aspect, the present invention provides a conductive polymer formed by the process of the first, second, third or fourth aspect of the invention.

In a sixth aspect, the present invention provides a substrate having a conductive polymer on a surface thereof, wherein the conductive polymer is formed by the process of the first, second, third or fourth aspect of the invention.

In a seventh aspect, the present invention provides a substrate having a conductive polymer on a surface thereof, wherein the polymer has a lamellar morphology as shown by atomic force microscopy (AFM).

In an eighth aspect, the present invention provides a substrate having a conductive polymer on a surface thereof, wherein the polymer has significant X-ray diffraction (XRD) intensities for [100], [200] and [300] peaks corresponding to the first, second, and third molecular layers of the PEDOT film.

DETAILED DESCRIPTION

The present invention provides a process for producing a conductive polymer. The process comprises providing a substrate having an oxidant layer on a surface thereof. The oxidant layer contains an oxidant, a solvent or blend of solvents, and a relatively high molecular weight non-ionic surfactant. The surface containing the oxidant layer is then exposed to a vapour containing an aryl or heteroaryl monomer that is polymerisable to form a conductive polymer without exposing the oxidant layer to an external source of water vapour. The aryl or heteroaryl monomer is then polymerised to form a polyaryl or polyheteroaryl conductive polymer on the surface of the substrate.

The substrate can be any suitable material including, but not limited to, glass, plastics, ceramics, silicon, organosiloxanes, paper, paper laminates, cellulose, carbon fibre, metals, rubber, etc. In embodiments the substrate is a glass substrate. In other embodiments, the substrate is a plastic substrate. The plastic may be selected from the group consisting of: polycarbonate, polyethylene, polypropylene, polystyrene, polytetrafluoroethylene, polyethylene terephthalate; polyethylene naphthalene dicarboxylate, tetrafluoroethylene-hexafluoropropylene copolymers, polyvinyl-difluoride, nylon, polyvinylchloride, copolymers of the aforementioned, and mixtures of the aforementioned. In other embodiments the substrate is a plastic glass, such as the material described in U.S. Pat. No. 6,638,454.

Optionally, the substrate may be coated with a conducting layer, such as an indium-tin oxide (ITO) layer, a fluorine doped tin oxide (FTO) layer, or an antinomy doped tin oxide (ATO) layer, to form an electrode. Substrates of this type may be used in electrochromic cells.

The surface of the substrate may be treated prior to deposition of the oxidant layer. For example, the surface may be treated by cleaning with a detergent, water, or a suitable solvent. Alternatively, or in addition, the surface may be treated by exposing the surface to air in a plasma chamber in order to activate the surface.

After treatment (if used) the substrate surface is coated with the oxidant layer. The oxidant layer may comprise a layer or coating containing any oxidant that is capable of oxidatively coupling aryl or heteroaryl monomers. In some embodiments the oxidant is a metal salt. Suitable metal salts are metal salts of main group or transition group metals. In some embodiments, the metal salt is a transition metal salt. The transition metal salt may be selected from the group consisting of salts of: iron(III), copper(II), chromium(VI), cerium(IV), manganese(IV), manganese(VII), ruthenium(III), and zinc(II).

The metal salt may be a salt of an inorganic or organic acid. Suitable salts of inorganic acids include: halides, such as $FeCl_3$; perchlorates, such as $Fe(ClO_4)_3$; phosphates, such as $FePO_4$; sulphates, such as $Fe_2(SO_4)_3$. Suitable salts of organic acids include: salts of $C_1$-$C_{20}$-alkanesulphonic acids, such as methanesulphonic, ethanesulphonic, propanesulphonic, butanesulphonic, and higher sulphonic acids, e.g. dodecanesulphonic acid; salts of aliphatic perfluorosulphonic acids such as trifluoromethanesulphonic acid, perfluorobutanesulphonic acid, and perfluorooctanesulphonic acid; salts of aliphatic $C_1$-$C_{20}$-carboxylic acids such as 2-ethylhexylcarboxylic acid; salts of aliphatic perfluorocarboxylic acids such as trifluoroacetic acid or perfluorooctanoic acid; salts of unsubstituted or substituted arylsulphonic acids, such as benzenesulphonic acid, ethylbenzene sulphonic acid, 1,3,5-trimethylbenzene(mesityl)sulfonic acid, 2-4 xylenesulphonic acid, o-toluenesulphonic acid, p-toluenesulphonic acid, and dodecylbenzenesulphonic acid; salts of cycloalkanesulphonic acids such as camphorsulphonic acid; salts of the sulphuric monoesters of $C_1$-$C_{20}$-alkanoles, such as lauryl sulphate. The oxidant may also be a mixture of salts.

In embodiments, the transition metal salt is an iron(III) salt of an arylsulphonic acid. In specific embodiments the oxidant is iron(III) p-toluenesulfonic acid tosylate. In other specific embodiments the oxidant is iron(III) benzenesulfonic acid. In other specific embodiments the oxidant is iron(III) p-ethylbenzenesulfonic acid. In other specific embodiments the oxidant is iron(III) benzoylacetonate.

The oxidant layer is formed on the surface of the substrate by coating using a solution of the oxidant in a suitable solvent. Standard solution coating techniques, such as dip coating, spray coating, spin coating, etc. may be used to coat the surface of the substrate with the oxidant layer. In embodiments, a solution of the oxidant in the solvent is spin coated onto the substrate surface. In embodiments the oxidant solution comprises 1% to 50% by weight of the oxidant. In embodiments the oxidant solution comprises 10% to 40% by weight of the oxidant. In embodiments the oxidant solution comprises 10% to 30% by weight of the oxidant. In embodiments the oxidant solution comprises 13% to 27% by weight of the oxidant. In embodiments the oxidant solution comprises 16% to 27% by weight of the oxidant. In embodiments the oxidant solution comprises 13% by weight of the oxidant. In embodiments the oxidant solution comprises 16% by weight of the oxidant. In embodiments the oxidant solution comprises 26.6% by weight of the oxidant.

Without intending to be bound by any particular theory, we suggest that the residual solvent in the oxidant layer effectively allows the oxidant to act like a fluid. We propose that the solvent, in conjunction with the relatively high molecular weight non-ionic surfactant, partitions into hydrophilic and hydrophobic regions resulting in a loose but structured fluid oxidant. Our suggested mechanism is supported by optical microscopy studies (FIG. 5) which show that an oxidant layer comprising a solvent or blend of solvents and a relatively high molecular weight non-ionic surfactant will back fill after the surface is scored, thus indicating that the layer is liquid like. During polymerisation grains grow until a confluent layer is formed and the fluid oxidant is then transported up through the grains by capillary action to present a new fresh layer of oxidant, allowing the process to continue. This structure results in directed growth of the conductive polymer. In this way, subsequent "layers" of forming conductive polymer are exposed to enough oxidant to enable the formation of high quality layers of polymer having high conductivity. Any known solvent may be used. The choice of solvent may take into consideration how "oil" like and how "polar" like the solvent needs to be.

In embodiments, the solvent or blend of solvents comprises at least one polar protic solvent. The polar protic solvent may be any polar solvent that contains a labile hydrogen atom. Typically, the protic solvent will have a hydrogen atom bound to an oxygen atom (e.g. a hydroxyl group) or a nitrogen atom (e.g. an amine group). As used herein, the term "polar protic solvent" specifically excludes water per se. However, it will be appreciated that the polar protic solvent may contain residual water in minor amounts. Examples of polar protic solvents include alcohols, formic acid, acetic acid, nitromethane, hydrogen fluoride, and ammonia. In embodiments, the polar protic solvent is an alcohol solvent. In specific embodiments the solvent is a $C_1$-$C_8$ alcohol. In embodiments, the alcohol is chosen from one or more of the group consisting of: methanol, ethanol, n-propanol, n-butanol, n-pentanol, n-hexanol, n-heptanol, and n-octanol. In embodiments, the solvent is a blend of $C_1$ to $C_8$ alcohols. In embodiments the solvent is a blend of a $C_4$ to $C_8$ alcohol and a $C_1$-$C_3$ alcohol. In embodiments the solvent is a blend of ethanol and n-butanol.

Without intending to be bound by any specific theory or mechanism, we suggest that polar aprotic solvents may act as co-surfactants (i.e. they have surface activity but do not lead to structured liquids on their own) and that this allows them to be trapped within the oxidant layer by the relatively high molecular weight non-ionic surfactant.

In other embodiments, the solvent or blend of solvents comprises a polar aprotic solvent. Polar aprotic solvents are solvents that have high dielectric constants and high dipole moments but lack an acidic hydrogen atom. Examples of polar aprotic solvents include, but are not limited to: dimethylformamide (DMF); acetonitrile (MeCN); dimethyl sulfoxide (DMSO); propylene carbonate; hexamethylphosphoramide (HMPA); tetrahydrofuran (THF); ethyl acetate; and acetone. In embodiments, the polar aprotic solvent is selected from one or more of the group consisting of dimethylformamide, acetonitrile; dimethyl sulfoxide; and propylene carbonate. In specific embodiments, the polar aprotic solvent is dimethylformamide.

Again, without intending to be bound by any specific theory or mechanism, we suggest that the polar aprotic solvent may release water molecules bound to the metal in the oxidant. For example, DMF may release up to six bound water molecules from the Fe (iron centres) of the oxidant solution. Since water is necessary for the polymerisation of PEDOT, by releasing the water molecules in a controlled manner we are able to control the thickness of the final PEDOT film. Specifically, we are able to produce very thin PEDOT films when a polar aprotic solvent is used. Thin films can also be achieved by spin casting a thinner oxidant layer but there is a limitation on how thin the oxidant layer can be whilst still retaining its flow properties. In contrast, when an aprotic polar solvent such as DMF releases water molecules from around the Fe centre the water is lost under the vacuum of the polymerisation chamber. Since less water is available not as much PEDOT is polymerised and, thus, we can use a thick oxidant layer which can flow but also produces very thin films.

In still other embodiments, the solvent or blend of solvents comprises an aromatic solvent. Suitable aromatic solvents include benzene, toluene, o-xylene, m-xylene and p-xylene.

In addition to the oxidant and residual solvent or solvent blend, the oxidant layer also includes the relatively high molecular weight non-ionic surfactant and, optionally, a relatively low molecular weight non-ionic or ionic hydrotrope. Again, without intending to be bound by any particular theory, we suggest that the relatively low molecular weight non-ionic or ionic hydrotrope (if present) helps adjust the partitioning into hydrophilic and hydrophobic layers as discussed in the preceding paragraph.

In embodiments the relatively high molecular weight non-ionic surfactant is an ABA or a BAB type copolymer wherein the A block comprises a polymer, composed of relatively hydrophilic units and the B block comprises a polymer composed of relatively hydrophobic units. In embodiments the relatively high molecular weight non-ionic surfactant is an ABA type copolymer.

Again without intending to be bound by any particular theory, we propose that the relatively high molecular weight non-ionic surfactant may serve a number of functions. Specifically, we suggest that the hydrophilic A block of the relatively high molecular weight non-ionic surfactant effectively coordinates with the iron or other metal centres of the oxidant, thereby excluding one or more molecules of water from the hydrated metal ion. In the case of an iron based oxidant, this binding negates the formation of Fe crystals. These crystals are an oxo-bridged dimer which effectively reduces the Fe(III) to Fe(II) and the Fe(II) is not a strong enough oxidant to polymerise the aryl or heteroaryl monomer. Coordination of the hydrophilic A block with the metal also liberates bound water molecules. We have found that water is necessary for the polymerisation to proceed. We suggest that the liberated water may reside on the hydrophilic A block as a loosely bound hydration shell and that the water is able to participate in the polymerisation process. In the absence of the hydrophilic A block, any water within the oxidant system may be lost under vacuum conditions.

We also propose that the relatively high molecular weight non-ionic surfactant templates the formation of the conductive polymer. The A block and B block moieties help form a hydrophilic hydrophobic partition within the oxidant solution. This, in conjunction with the solvent, helps form the structuring within the oxidant solution. By choosing the appropriate ratio of A block to B block and molecular weight in conjunction with the solvent it may be possible to modify the hydrophilic hydrophobic domains and direct the structure being formed.

We also propose that a proportion of the relatively high molecular weight non-ionic surfactant is transported into the conductive polymer during formation. This is not able to be washed out post polymerisation. The high dielectric constant of the relatively high molecular weight non-ionic surfactant may help shield the counter ions from the conductive polymer, allowing easier charge migration along the polymer.

In embodiments, the molecular weight of the relatively high molecular weight non-ionic surfactant is equal to or greater than about 1000. In embodiments, the molecular weight of the relatively high molecular weight non-ionic surfactant is from about 1000 to about 10000. In embodiments, the molecular weight of the relatively high molecular weight non-ionic surfactant is from about 1000 to about 9000. In embodiments, the molecular weight of the relatively high molecular weight non-ionic surfactant is from about 1000 to about 8000. In embodiments, the molecular weight of the relatively high molecular weight non-ionic surfactant is from about 1000 to about 7000. In embodiments, the molecular weight of the relatively high molecular weight non-ionic surfactant is from about 1000 to about 6000. In embodiments, the molecular weight of the relatively high molecular weight non-ionic surfactant is from about 1000 to about 5800. In embodiments, the molecular weight of the relatively high molecular weight non-ionic surfactant is from about 1100 to about 5800. In embodiments, the molecular weight of the relatively high molecular weight non-ionic surfactant is 1100. In embodiments, the molecular weight of the relatively high molecular weight non-ionic surfactant is 2900. In embodiments, the molecular weight of the relatively high molecular weight non-ionic surfactant is 4400. In embodiments, the molecular weight of the relatively high molecular weight non-ionic surfactant is 5800.

In embodiments, the relatively high molecular weight non-ionic surfactant is a triblock copolymer. In embodiments it is a glycol based copolymer. The A block may comprise a polymer composed of ethylene glycol units (i.e. a polyethylene glycol polymer). The B block may comprise a polymer composed of alkylene glycol units having 3 to 10 carbon atoms in the alkylene moiety of each unit. In embodiments, the B block is composed of alkylene glycol units having 3 to 5 carbon atoms. In embodiments the B block is composed of alkylene glycol units having 3 carbon atoms (i.e. a polypropylene glycol polymer). In embodiments, the B block is composed of alkylene glycol units having 4 carbon atoms. In embodiments, the B block is composed of alkylene glycol units having 5 carbon atoms. In embodiments, the B block is composed of alkylene glycol units having 6 carbon atoms. In embodiments, the B block is composed of alkylene glycol units having 7 carbon atoms. In embodiments, the B block is composed of alkylene glycol units having 8 carbon atoms. In embodiments, the B block is composed of alkylene glycol units having 9 carbon atoms. In embodiments, the B block is composed of alkylene glycol units having 10 carbon atoms.

In specific embodiments the triblock copolymer is selected from the group consisting of: a poly(ethylene glycol)-poly(propylene glycol)-polyethylene glycol) (PEG-PPG-PEG) triblock polymer and a poly(propylene glycol)-poly(ethylene glycol)-poly(propylene glycol) (PPG-PEG-PPG) triblock polymer.

Depending on the structure, molecular weight, and the A and B components of the triblock copolymer, it may be obtained commercially or it may be obtained, for example, by selecting a hydrophobic block segment and a hydrophilic block segment and then synthesizing the polymer using standard techniques.

In WO/2009/117761 we suggested that exposure of the oxidant layer to water at any stage prior to the step of exposing the substrate having the oxidant layer to a vapour containing an aryl or heteroaryl monomer may be detrimental to the formation of the polyaryl or polyheteroaryl electroactive polymer films and that addition of an amphiphilic polymer into the oxidant layer inhibits crystallisation of the oxidant and extends the range of humidity that can be tolerated in the polymerization step. However, while we now suggest that the effect of externally supplied water, that is the humidity range, is less detrimental to the formation of the polyaryl or polyheteroaryl electroactive polymer films, the complete removal under vacuum is the preferred option.

In embodiments, the relatively low molecular weight non-ionic or ionic hydrotrope has a molecular weight of equal to or less than about 200.

In embodiments, the relatively low molecular weight non-ionic or ionic hydrotrope has a dielectric constant that is greater than about 20 at 20° C. A relatively low molecular weight non-ionic or ionic hydrotrope having a dielectric constant greater than about 20 at 20° C. is likely to be ionic and is most likely to reside in the hydrophilic region formed as described previously.

In other embodiments, the relatively low molecular weight non-ionic or ionic hydrotrope has a dielectric constant that is less than about 20 at 20° C. A relatively low molecular weight non-ionic or ionic hydrotrope having a dielectric constant less than about 20 at 20° C. is likely to reside in the hydrophobic region formed as described previously.

In embodiments, the relatively low molecular weight non-ionic or ionic hydrotrope is an alkylene glycol. The alkylene glycol may be ethylene, propylene or butylene glycol having a molecular weight of equal to or less than about 200. Suitable alkylene glycols include ethylene glycol (MW 62.07), diethylene glycol (MW 106.12), triethylene glycol (MW 150.17), and tetraethylene glycol (MW 194.23).

In other embodiments, the relatively low molecular weight non-ionic or ionic hydrotrope is an alkyloxy alcohol. Suitable alkyloxy alcohols include 2-methoxyethanol (MW 76.09), 2-ethoxyethanol (MW 90.12), 2-propoxyethanol (MW 104.15), 2-butoxyethanol (MW 118.18), and 2-phenoxyethanol (MW 138.16).

In other embodiments, the relatively low molecular weight non-ionic or ionic hydrotrope is an alkylene diol. Suitable alkylene diols include 1,2 ethanediol (MW 62.07), 1,3 propanediol (MW 76.09), 1,4 butanediol (MW 90.12), and 1,5 pentanediol (MW 104.15).

In other embodiments, the relatively low molecular weight non-ionic or ionic hydrotrope is an thioalkyl alcohol. Suitable thioalkyl alcohols include 2,2' thiodiethanol (MW 122.19) and 2,2' dithiodiethanol (MW 154.24).

The exact role of the relatively low molecular weight non-ionic or ionic hydrotrope is unclear at this stage. We expect that it will reside within the hydrophilic region of the oxidant and so may tune the size of this region with respect to the hydrophobic region. In this respect, the dielectric constant of the relatively low molecular weight non-ionic or ionic hydrotrope may be selected so that it preferentially resides in either the hydrophilic region or the hydrophobic region. In this way the domain sizes of either of those regions may be altered using an appropriately selected hydrotrope. Moreover, the relatively low molecular weight non-ionic or ionic hydrotrope is smaller than the relatively high molecular weight non-ionic surfactant and, therefore, it may also preferentially be transported into the conductive polymer during synthesis.

The surface containing the oxidant layer is exposed to a vapour containing an aryl or heteroaryl monomer that is polymerisable to form a conductive polymer.

As used herein, the term "aryl" means (i) an optionally substituted monocyclic, or fused polycyclic, aromatic carbocycle (ring structure having ring atoms that are all carbon) preferably having from 5 to 12 atoms per ring. Examples of aryl groups include phenyl, naphthyl, and the like; (ii) an optionally substituted partially saturated bicyclic aromatic carbocyclic moiety in which a phenyl and a $C_{5-7}$ cycloalkyl or $C_{5-7}$ cycloalkenyl group are fused together to form a cyclic structure, such as tetrahydronaphthyl, indenyl or indanyl.

As used herein, the term "heteroaryl" means a group containing an aromatic ring (preferably a 5 or 6 membered aromatic ring) having one or more heteroatoms as ring atoms in the aromatic ring with the remainder of the ring atoms being carbon atoms. Suitable heteroatoms include groups 15 and 16 of the periodic table. Particularly suitable heteroatoms include but are not limited to: nitrogen; oxygen; selenium; tellurium; phosphorus; and sulphur. Examples of heteroaryl include thiophene, benzothiophene, selenophene, benzofuran, benzimidazole, benzoxazole, benzothiazole, benzisothiazole, naphtho[2,3-b]thiophene, furan, isoindolizine, xantholene, phenoxatine, pyrrole, imidazole, pyrazole, pyridine, pyrazine, pyrimidine, pyridazine, indole, isoindole, 1H-indazole, purine, quinoline, isoquinoline, phthalazine, naphthyridine, quinoxaline, cinnoline, carbazole, phenanthridine, acridine, phenazine, thiazole, isothiazole, phenothiazine, oxazole, isooxazole, furazane, phenoxazine, 2-, 3- or 4-pyridyl, 2-, 3-, 4-, 5-, or 8-quinolyl, 1-, 3-, 4-, or 5-isoquinolinyl 1-, 2-, or 3-indolyl, and 2-, or 3-thienyl, and substituted derivatives of any of the aforementioned.

The polyaryl or polyheteroaryl conductive polymer film is formed by exposing the surface containing the oxidant layer to a vapour containing an aryl or heteroaryl monomer that is polymerizable to form a conductive polymer. The exposure is carried out under conditions to form the polymer on the surface of the substrate.

The vapour phase polymerization of aryl or heteroaryl monomers, such as EDOT, can be carried out at atmospheric pressure in a sealed chamber or at reduced pressure in a vacuum chamber. Thus, the step of exposing the surface containing the oxidant layer to a vapour containing an aryl or heteroaryl monomer may include placing the substrate having the oxidant layer on the surface in a chamber, sealing the chamber, introducing a vapour containing the aryl or the heteroaryl monomer into the chamber, and maintaining the substrate at a temperature suitable for polymerization of the aryl or the heteroaryl monomer so as to form a polymer film on the surface.

A suitable vacuum chamber arrangement is shown in WO 2009/117761.

The conductive polymer may be selected from the group consisting of:

polyaryl polymers, such as polyphenylene, polyphenylenesulfide, polyaniline, polyquinone, polyfluorene, polyanthraquinone, poly-1,4-phenylene vinylene (PPV), and 2-methoxy-5-ethylhexyloxy poly-1,4-phenylene vinylene (MEH-PPV);

polyheteroaryl polymers, such as polythiophene (PTh), polyselenophene, poly(3,4-ethylenedioxyselenophene) (PEDOS), polypyrrole (PPy), polyfuran (Pfu), polycarbazole (PCz), poly-3,4-ethylenedioxythiophene (PEDOT), poly(3,4-propylenedioxythiophene (ProDOT), poly-3,4-(2,2-dimethylpropylene)dioxythiophene (ProDOT-Me$_2$), poly-3,4-ethylenedioxypyrrole (PEDOP), poly-3,4-propylenedioxypyrrole (ProDOP), poly-N-(3-sulfonatopropoxy)-3,4-propylenedioxypyrrole (PProDOP-NPS), poly-1,2-bis(2-ethylenedioxythienyl)vinylene (PBEDOT-V), poly-1,2-bis(2-propylenedioxythienyl)vinylene (PProDOT-V), poly-2,5-bis(2-ethylenedioxythienyl)pyridine (PBEDOT-Pyr), poly-1,4-bis(2-ethylendioxythienyl)-2,5-didodecyloxybenzene (PBEDOT-B(OCi$_2$H$_{25}$)2), poly-3-methylthiophene (P3MTh), poly(3-hexylthiophene) (P3HT), poly-2,5-(2-ethylenedioxythienyl)furan (PBEDOT-Fu), poly-4,4'-(2-ethylenedioxythienyl)biphenyl (PBEDOT-BP), poly-3,6-(2-ethylenedioxythienyl)carbazole (PBEDOT-Cz), poly-3-butylthiophene (P3BTh), alkyl poly-3,4-ethylenedioxythiophene (PEDOT-alkyl), aryl poly-3,4-ethylenedioxythiophene (PEDOT-aryl), poly(3,4-ethyleneoxythioselenophene) (PEOTS), poly(3,4-ethylenedithioselenophene) (PEDTS), poly(3,4-ethyleneoxythiothiophene) (PEOTT), poly(3,4-ethylenedithiothiophene) (PEDTT), poly-2,5-(2-thienyl)pyrrole (PSNS), polyviologen (PV), poly-metal phthalocyanines (PM Phth), poly-5,5'-biethylenedioxythiophene (PBiEDOT), poly-1,2-(2-ethylene dioxythienyl) cyanovinylene (PBEDOT-CNV), poly-1,2-(2-thienyl)cyanovinylene (PBTh-CNV), poly[2,5-bis (2ethylenedioxythienyl)-diphenylpyridopyrazine] (PBEDOT-PyrPyr(Ph)$_2$), polythiopehenvinylene, polythiazole, poly(p-pyridine), poly(p-pyridalvinylene), and polyindole;

and derivatives of any of the aforementioned.

A range of conductive polymers that may be formed using the processes of the present invention are described in: (i) Gustafsson, J. C. et al, Solid State Ionics 1994, 69,145-152; (ii) Handbook of Oligo- and Polythiophenes 1999, Ch 10.8, Ed D Fichou, Wiley-VCH, Weinhem; (iii) Schottland, P. et al, Macromolecules, 2000, 33, 7051-7061; (iv) Onoda M., Journal of the Electrochemical Society 1994, 141, 338-341; (v) Chandrasekar, M., Conducting Polymers, Fundamentals and Applications, a Practical Approach 1999, Kluwer Academic Publishers, Boston; (vi) Epstein, A. J. et al, Macromol Chem, Macromol Symp 1991, 57,217-234.

In embodiments, the conductive polymer is selected from the group including but not limited to: polypyrrole (PPy); poly(3,4-ethylenedioxythiophene) (PEDOT); poly(3,4-ethylenedioxyselenophene) (PEDOS); poly(3-hexylthiophene) (P3HT); poly(3,4-ethylenedithiothiophene) (PEDTT); poly (3,4-ethyleneoxythioselenophene) (PEOTS); poly(3,4-ethylenedithioselenophene) (PEDTS); poly(3,4-ethyleneoxythiothiophene) (PEOTT); and poly(3,4-ethylenedithiothiophene) (PEDTT).

In specific embodiments, the conductive polymer is selected from the group consisting of: polypyrrole (PPy); poly(3,4-ethylenedioxythiophene) (PEDOT); poly(3,4-ethylenedioxyselenophene) (PEDOS); poly(3-hexylthiophene) (P3HT); and poly(3,4-ethylenedithiothiophene) (PEDTT).

In embodiments the conductive polymer is a poly-3,4-alkylenedioxythiophene, such as, but not limited to: poly-3,4-methylenedioxythiophene; poly-3,4-methylenedioxythiophene derivatives; poly-3,4-ethylenedioxythiophene; poly-3,4-ethylenedioxythiophene derivatives; poly-3,4-propylenedioxythiophene; poly-3,4-propylenedioxythiophene derivatives; poly-3,4-butylenedioxythiophene; poly-3,4-butylenedioxythiophene derivatives; and copolymers of any of the aforementioned.

In specific embodiments the conductive polymer is poly-3,4-ethylenedioxythiophene (PEDOT).

In other specific embodiments the conductive polymer is poly-3,4-propylenedioxythiophene (PRODOT).

After the vapour phase polymerization process has finished the newly formed polymer film may be washed with a solvent to remove any spent oxidant and/or unreacted monomer remaining within the polymer matrix, thereby allowing for compaction of the conductive polymer film. Suitable wash methods include spraying the substrate containing the polymer film with a solvent for a period of about 1 to about 30 minutes. Alternatively, the substrate containing the polymer film may be dipped in to a bath containing the solvent for a period of about 1 to about 30 minutes. Suitable solvents include (but are not limited to): lower alkyl alcohols, such as methanol, ethanol, n-propanol, i-propranol, etc; water. A 15 minute ethanol or water bath or an ethanol or water spray rinse may be particularly suitable. Alternatively, a combination of spray rinsing and bath rinsing may be suitable. In some embodiments, the newly formed polymer film may be spray rinsed, allowed to dry, dipped into a bath, allowed to dry and then spray rinsed again.

Using a combination of x-ray diffraction and atomic force microscopy we have shown that highly ordered, aligned conductive polymers can be formed using the methods described herein (FIG. 2). For example, PEDOT polymers formed in the presence of a PEG-PPG-PEG triblock copolymer of molecular weight 5800 form a flat, lamellar structure in which the polymer chains are aligned. This explains the high conductivity observed. When the molecular weight of the triblock copolymer is decreased to 2900 the conductive polymer has a "cauliflower" appearance when formed and has less of the flat, lamellar structure. Concomitantly, the conductively of the latter conductive polymer is not as high. These observations support our proposal that the relatively high molecular weight non-ionic surfactant templates the formation of the conductive polymer.

Optionally, the oxidant layer may further comprise a surfactant having a strongly electronegative moiety. The surfactant having a strongly electronegative moiety may help "withdraw" the electrons in the aryl or heteroaryl ring in the conductive polymer, thereby allowing the charge to travel along the conjugated backbone of the polymer more easily, resulting in higher conductivity. The surfactant having a strongly electronegative moiety may be added to the oxidant solution layer in an amount of from 0 wt % to about 10 wt %. The surfactant having a strongly electronegative moiety may be a fluorosurfactant. Suitable fluorosurfactants for this purpose include the one available commercially under the trade name Zony[1]® FS-300 ($R_fC_{H2}C_{H2}O(C_{H2}C_{H2}O)_xH$) (DuPont), Zony[1]® 7950, Zony[1]® FSA, Zony[1]® FSO, Zony[1]® FSO-100, and derivatives of any of the aforementioned fluorosurfactants.

Alternatively, or in addition, the conductive polymer may comprise a surfactant having a strongly electronegative moiety that is added to the conductive polymer after polymerisation. The surfactant having a strongly electronegative moiety may be a fluoropolymer. A suitable fluorosurfactant for this purpose is available commercially under the trade name CYTOP. CYTOP is an amorphous fluoropolymer that is commercially available from AGC Chemicals Europe.

Optionally, one or more additives may be included in the conductive polymer filth. The additive(s) can be introduced in to the polymer film by washing the polymer film with a solution containing the additive (as described by Winther-Jensen et al., Polymer 2005, 46, 4664-4669). Alternatively, the additive(s) can be added to the oxidant layer at the time of coating the oxidant layer on to the substrate.

Additives that can be included in the polymer film include: nanoparticles, conductive agents, electrolytes, redox agents, coloring agents, UV stabilizing agents, adhesion promoting agents, heat stabilizing agents, anti-oxidizing agents, flame retarding agents, polymers, electrochromic liquids, and combinations thereof. The type and quantity of the additive used will depend upon the specific application of the resulting conductive polymer.

Nanoparticles that can be added to the polyaryl or polyheteroaryl conductive polymer film include, but are not limited to $TiO_2$, $SiO_2$, Ag, Au, and PTFE nanoparticles. Nanoparticles can be added to the polymer film for a variety of reasons. For example, $TiO_2$ nanoparticles can change the work function of the active material and can make films more efficient by separating the charge better. $SiO_2$ nanoparticles can be added to increase the efficiency of organic LEDs. Au/Ag nanoparticles may be used for sensor applications. Other nanoparticles can be added to change the optical, mechanical and/or wetting properties of the films.

Conductive agents that can be added to the polyaryl or polyheteroaryl conductive polymer film include, but are not limited to, tin oxide particles, indium tin oxide (ITO) particles, antinomy doped tin oxide (ATO) particles, grapheme, carbon nanotubes, metallic nanowires, polythiophene, nickel oxide, polyvinylferrocene, polyviologen, tungsten oxide, iridium oxide, molybdenum oxide, Prussian blue (ferric ferrocyanide), etc. These agents can be added to the polyaryl or polyheteroaryl conductive polymer film to improve the conductivity of the film. Other additives known to improve the conductivity of conductive films could also be used.

Electrolytes can be included in the conductive polymer film to assist or enhance the conductivity of the electrical current passing therethrough. Suitable electrolytes include, but are not limited to, tetraethylammonium perchlorate, tetrabutylammonium tetrafluoroborate, tetrabutylammonium hexafluorophosphate, tetrabutylammonium trifluoromethane sulfonate, lithium salts and combinations thereof.

Redox active agents can be included in the conductive polymer film. Any suitable anti-oxidant or antireductant may be used. For example, organic substances like vitamin C, alcohols, polyalcohols or sugars could be used. Alternatively, or in addition, inorganic substances like salts including species that may be oxidised (e g Fe to Fe3+, Sn2+ to Sn4+), metal clusters (e g a Cu cluster or a Fe cluster), salts comprising species that may be reduced (e g Fe to Fe2+, Sn4+ to Sn2+), or metal organic complexes like ferrocenes, phthalocyanines, and metalloporphyrines.

Coloring agents that can be added to the conductive polymer film include, but are not limited to, phenol red, Xylene Cyanol FF, thymol blue, m-cresol purple, cresol red, phthalocyanine blue, etc.

Stabilizers that can be added to the conductive polymer film include, but are not limited to, UV stabilizers. The UV stabilizer can be any compatible UV absorbing compound chosen from the large number of compounds well known in the art. Examples of classes of UV absorbing compounds that can be used include: benzoxazinones; benzotriazoles; triazines; diphenylcyanoacrylates; and derivatives thereof. Examples of UV absorbers include, but are not limited to, Cyagard 1 164L, Cyagard 3638, Cyagard UV 531, Cyagard UV 5411, Cyagard UV 9, Cyasorb 1084, Cyasorb 1164, Cyasorb 284, Cyasorb UV 1988, Cyasorb UV 2098, Cyasorb UV 2126, Cyasorb UV 24, Cyasorb UV 2908 (Cyasorb is a trademark owned by Cytec Technology Corp.); Eastman Inhibitor RMB (Resorcinol Monobenzoate, available through Bio-Rad); Givsorb UV-1, Givsorb UV-2, Givsorb UV-13, Givsorb UV-14, Givsorb UV-15, Givsorb UV-16 (Givsorb is a trademark registered to Givaudan Corporation); Mark 1535, Mark 446 (available through Bio-Rad), Maxgard 200, Maxgard 800 (Maxgard is a trademark registered to Garrison Industries, Inc.); Norbloc 6000, Norbloc 7966 (Norbloc is a trademark registered to Johnson & Johnson); Quercetin; Sanduvor 3206, Sanduvor EPU, Sanduvor VSU (Sanduvor is a trademark registered to Sandoz Ltd.); Seesorb 201 (phenyl salicylate); Syntase 1200 (Neville-Synthese Organics, Inc.), THPE BZT, Tinuvin P (2-(2'-Hydroxy-5'-methylphenyl)benzotriazole 2-(2H-Benzotriazol-2-yl)-4-methylphenol 2-(2H-benzotriazol-2-yl)-p-cresol), Tinuvin 123, Tinuvin 171, Tinuvin 5055, Tinuvin 5151, Tinuvin 99-2, Tinuvin 144, Tinuvin 292, Tinuvin 384-2, Tinuvin 5050, Tinuvin 5060, Tinuvin 99, Tinuvin 109, Tinuvin 1 130, Tinuvin 120, Tinuvin 1545, Tinuvin 1577FF, Tinuvin 320, Tinuvin 326, Tinuvin 327, Tinuvin 328, Tinuvin 384, Tinuvin 400, Tinuvin 400-2, Tinuvin 571, Tinuvin 840, Tinuvin 900, Tinuvin 928, Tinuvin P (Tinuvin is a trademark registered to Ciba-geigy Corporation); Uvinul 3035, Uvinul 3039, Uvinul 3048, Uvinul 400, Uvinul D 49, Uvinul D 50, Uvinul P 25, Uvinul T-150 (Uvinul is trademark owned by BASF Corporation).

Adhesion promoting agents can be added to conductive polymer film to enhance the degree to which the films adhere to any contacting surfaces, such as the substrate surface. Suitable adhesion promoting agents include, but are not limited to: silane coupling agents, and commercially available adhesion promoting agents like those sold by Sartomer Co., such as Alkoxylated Trifunctional Acrylate (9008), Trifunctional Methacrylate Ester (9010 and 9011), Trifunctional Acrylate Ester (9012), Aliphatic Monofunctional Ester (9013 and 9015) and Aliphatic Difunctional Ester (9014).

The quality of a conductive polymer film that is formed according to the present invention can be assessed by measuring the sheet resistance (or conductivity) of the film. Using the processes of the present invention, it is possible to form a conductive polymer film having a sheet resistance of between about 25 ohms/square and about 135 ohms/square. In some embodiments, the conductive polymer film has a sheet resistance of between about 25 ohms/square and about 40 ohms/square.

In embodiments, the conductivity of the conductive polymer film is $\geq 1000$ S.cm$^{-1}$. In embodiments, the conductivity of the conductive polymer film is $\geq 1500$ S.cm$^{-1}$. In embodiments, the conductivity of the conductive polymer film is $\geq 1600$ S.cm$^{-1}$. In embodiments, the conductivity of the conductive polymer film is $\geq 1700$ S.cm$^{-1}$. In embodiments, the conductivity of the conductive polymer film is $\geq 1800$ S.cm$^{-1}$. In embodiments, the conductivity of the conductive polymer film is $\geq 1900$ S.cm$^{-1}$. In embodiments, the conductivity of the conductive polymer film is $\geq 2000$ S.cm$^{-1}$. In embodiments, the conductivity of the conductive polymer film is $\geq 2100$ S.cm$^{-1}$. In embodiments, the conductivity of the conductive polymer film is $\geq 2200$ S.cm$^{-1}$. In embodiments, the conductivity of the conductive polymer film is $\geq 2300$ S.cm$^{-1}$. In embodiments, the conductivity of the conductive polymer film is $\geq 2400$ S.cm$^{-1}$. In embodiments, the conductivity of the conductive polymer film is $\geq 2500$ S.cm$^{-1}$. In embodiments, the conductivity of the conductive polymer film is $\geq 2600$ S.cm$^{-1}$. In embodiments, the conductivity of the conductive polymer film is $\geq 2700$ S.cm$^{-1}$. In embodiments, the conductivity of the conductive polymer film is $\geq 2800$ S.cm$^{-1}$. In embodiments, the conductivity of the conductive polymer film is $\geq 2900$ S.cm$^{-1}$. In embodiments, the conductivity of the conductive polymer film is $\geq 3000$ S.cm$^{-1}$.

In embodiments, the conductivity of the conductive polymer film is 1500 S.cm$^{-1}$. In embodiments, the conductivity of the conductive polymer film is 1900 S.cm$^{-1}$. In embodiments, the conductivity of the conductive polymer film is 2200 S.cm$^{-1}$. In embodiments, the conductivity of the conductive polymer film is 3300 S.cm$^{-1}$.

Polyaryl and polyheteroaryl polymer films can also be characterised or analysed by other suitable techniques, such as UV-vis-NIR spectroscopy, optical microscopy, XPS, AFM, mass spectroscopy, etc.

The thickness of the polyaryl or polyheteroaryl polymer films will typically be about 20 nm to about 300 nm. Films having a thickness of between about 50 nm and about 150 nm are particularly suitable.

EXAMPLES

Materials

Figure 1:
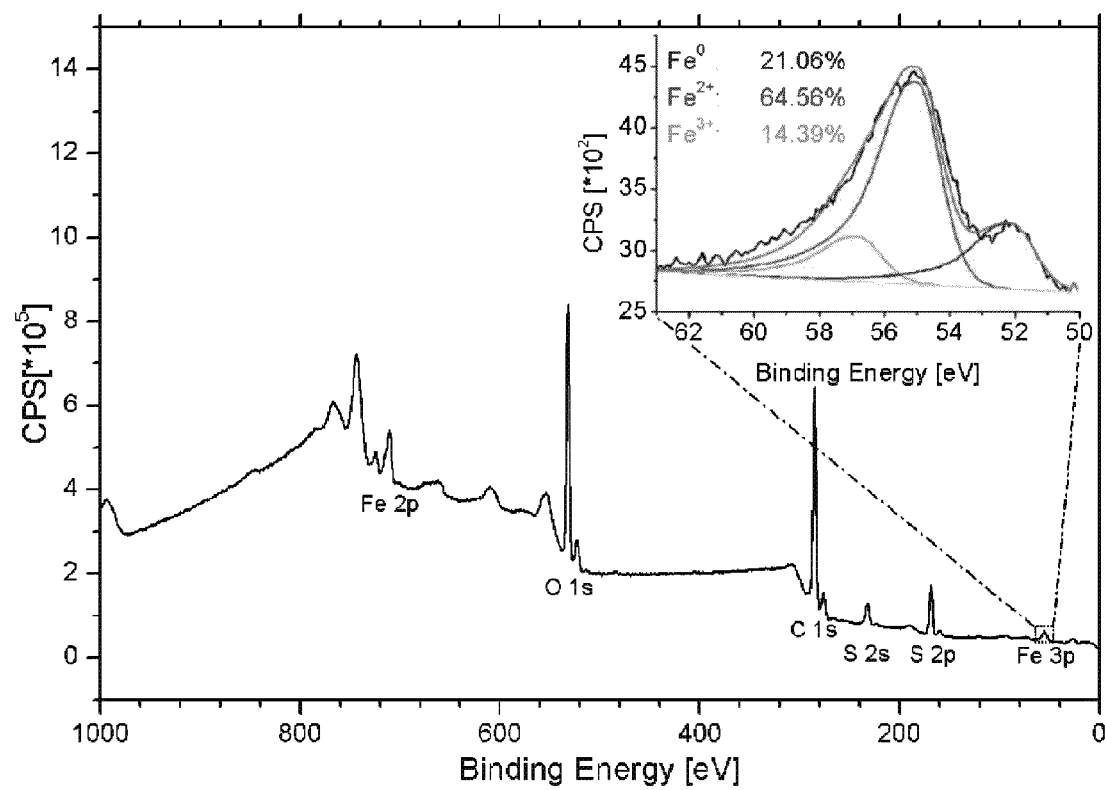
FIG. 1 shows a wide scan XPS spectra for unwashed PEDOT (i.e. PEDOT plus oxidant) polymerised for 25 min from the PEG-PPG-PEG oxidant film. Note the presence of Fe in this spectra, indicating it resides at the topmost surface of the PEDOT film. The inset depicts the analysis of the Fe 3p portion of the binding energy spectra.

Fe(III) tosylate (Fe(Tos)$_3$) was received from Clevios (Germany) as a 40 wt. % solution in butanol (Clevios CB 40). 3,4-ethylenedioxythiophene (EDOT) monomer, n-butanol, pyridine and the tri-block polymer poly(ethylene glycol-propylene glycol-ethylene glycol) (PEG-PPG-PEG), Mw=2900 or 5800 Da. were obtained from Aldrich. All chemicals were used as received.

Preparation of Substrates

Oxidant thin films were deposited on glass microscope slides. The substrates were washed using a mild detergent, then ethanol, and finally rinsed using high purity water. Prior to coating, the substrates were air plasma treated (Diener, Plasma etcher NANO, Germany) for 2 minutes.

Characterisation of Conductive Polymer Films

The electrical conductivity of the conductive polymers may be determined as described in Fabretto (Fabretto M., et al. *Macromol. Chem. Phys.* 2011 212, DOI: 10.1002/macp.201100303).

Measuring the conductivity is a two part process. The sheet resistance is measured (typically) using a 4-point probe. The reading will be in ohms/square. The film thickness is then measured. An atomic force microscope (AFM) or a mechanical profilometer can be used for this purpose. Typically, the measured sheet resistance is an average of 10 readings across the substrate. The drive current of the 4 point probe is sufficiently high so that any internal (or external) voltage offsets due to dissimilar metal contacts is negligible compared to the voltage drop across the measurement pins. Measurements are performed with a forward and reverse drive current. This averages out the voltage offset errors.

To measure the film thickness a scratch is placed through the polymer using a soft scalpel. An AFM scan is then performed across the polymer/no polymer step. The average of 10 line scans is taken. The AFM is calibrated prior to measurement using a 100 nm step height calibration plate.

Conductivity is then calculated using the following formula:

$$\sigma = 1/(R.t)$$

where $\sigma$=conductivity in S.cm$^{-1}$
R=sheet resistance in ohms/square
T=film thickness in cm.

Example 1

Formation of ICPs in the Presence of Butanol Solvent 3.33 g of the Fe(III) tosylate solution was diluted with 1.66 g butanol solvent and 0.75 g 2900 MW PEG-PPG-PEG triblock was added. The solution was added to the substrate and spin coated (400B-6NPP, Laurell Technologies Inc.) at 1500 rpm for 20 seconds. It was then placed on a 70° C. hotplate for 30 seconds. Immediately after heating, samples were placed into a 115 L vacuum chamber oven (Binder, Germany) set to 35° C. The chamber was pumped down to 45 mBar, maintained at this pressure for 25 minutes, and then vented to atmosphere.

Samples were then placed into a 115 L vacuum chamber oven (Binder, Germany) set to 35° C. The chamber was pumped down to 45 mbar and the internally mounted knife valve was opened allowing ingress of EDOT monomer which was maintained at 45° C. After 25 minutes the chamber was vented to the atmosphere and the samples were removed and then placed on a 70° C. hotplate for 2 minutes to anneal the polymer. The sample was then carefully rinsed in an ethanol bath to remove spent oxidant, unbound surfactant, and residual un-reacted monomer. Samples were then air dried.

The conductivity of the sample was 1500 (±200) S.cm$^{-1}$.

Example 2

Formation of ICPs in the Presence of Butanol Solvent and a Low Molecular Weight or Ionic Hydrotrope 3.33 g of the Fe(III) tosylate solution was diluted with 1.66 g butanol solvent and 0.75 g 2900 MW PEG-PPG-PEG triblock and 0.0625 g diethylene glycol were added. The solution was added to the substrate and spin coated (400B-6NPP, Laurell Technologies Inc.) at 1500 rpm for 20 seconds. It was then placed on a 70° C. hotplate for 30 seconds. Immediately after heating, samples were placed into a 115 L vacuum chamber oven (Binder, Germany) set to 35° C. The chamber was pumped down to 45 mBar, maintained at this pressure for 25 minutes, and then vented to atmosphere.

Samples were then placed into a 115 L vacuum chamber oven (Binder, Germany) set to 35° C. The chamber was pumped down to 45 mbar and the internally mounted knife valve was opened allowing ingress of EDOT monomer which was maintained at 45° C. After 25 minutes the chamber was vented to the atmosphere and the samples were removed and then placed on a 70° C. hotplate for 2 minutes to anneal the polymer. The sample was then carefully rinsed in an ethanol bath to remove spent oxidant, unbound surfactant, and residual un-reacted monomer. Samples were then air dried.

The conductivity of the sample was 1900 (±200) S.cm$^{-1}$.

Example 3

Formation of ICPs in the Presence of Butanol Solvent 2 g of the Fe(III) tosylate solution was diluted with 3 g butanol solvent and 1.5 g 5800 MW PEG-PPG-PEG triblock was added. The solution was added to the substrate and spin coated (400B-6NPP, Laurell Technologies Inc.) at 1500 rpm for 20 seconds. It was then placed on a 70° C. hotplate for 30 seconds. Immediately after heating, samples were placed into a 115 L vacuum chamber oven (Binder, Germany) set to 35° C. The chamber was pumped down to 45 mBar, maintained at this pressure for 25 minutes, and then vented to atmosphere.

Samples were then placed into a 115 L vacuum chamber oven (Binder, Germany) set to 35° C. The chamber was pumped down to 45 mbar and the internally mounted knife valve was opened allowing ingress of EDOT monomer which was maintained at 45° C. After 25 minutes the chamber was vented to the atmosphere and the samples were removed and then placed on a 70° C. hotplate for 2 minutes to anneal the polymer. The sample was then carefully rinsed in an ethanol bath to remove spent oxidant, unbound surfactant, and residual un-reacted monomer. Samples were then air dried.

The conductivity of the sample was 2200 (±200) S.cm$^{-1}$.

Example 4

Formation of ICPs in the Presence of Ethanol Solvent 2 g of the Fe(III) tosylate solution was diluted with 3 g ethanol solvent and 1.5 g 5800 MW PEG-PPG-PEG triblock was added. The solution was added to the substrate and spin coated (400B-6NPP, Laurell Technologies Inc.) at 1500 rpm for 20 seconds. It was then placed on a 70° C. hotplate for 30 seconds. Immediately after heating, samples were placed into a 115 L vacuum chamber oven (Binder, Germany) set to 35° C. The chamber was pumped down to 45 mBar, maintained at this pressure for 25 minutes, and then vented to atmosphere.

Samples were then placed into a 115 L vacuum chamber oven (Binder, Germany) set to 35° C. The chamber was pumped down to 45 mbar and the internally mounted knife valve was opened allowing ingress of EDOT monomer which was maintained at 45° C. After 25 minutes the chamber was vented to the atmosphere and the samples were removed and then placed on a 70° C. hotplate for 2 minutes to anneal the polymer. The sample was then carefully rinsed in an ethanol bath to remove spent oxidant, unbound surfactant, and residual un-reacted monomer. Samples were then air dried.

The conductivity of the sample was 3300 (±200) S.cm$^{-1}$.

Example 5

XPS Analysis of ICPs

To examine whether EDOT monomer is transported down through the forming granular PEDOT layer to the underlying oxidant via diffusion (top-down growth mechanism) or the oxidant is transported up to the surface through the granular PEDOT layer via capillary transport (bottom-up growth mechanism), XPS experiments were conducted to elucidate the presence and concentration of Fe species at the topmost (upper) surface of the PEDOT films using the oxidant containing the surfactant PEG-PPG-PEG. FIG. 1 shows the wide scan spectra which demonstrates Fe is present at the topmost surface of a ca. 150 nm PEDOT film grown for 25 min. The inset shows the analysis of the Fe 3p binding energies, which indicate the presence of $Fe^{3+}$, $Fe^{2+}$ and interestingly $Fe^0$.

The ratio of 'fresh' (i.e. $Fe^{3+}$) to 'spent' (i.e $Fe^{2+}$) oxidant at the topmost layer of the unwashed PEDOT film was measured as per the spectral fitting in the inset of FIG. 1. Firstly, the presence of an $Fe^{3+}$ signal after 25 minutes of polymerization eliminates the top-down growth mechanism, given that the expectation for this mechanism is that no $Fe^{3+}$ signal should be present once the PEDOT layer had exceeded 10 nm (unless pinhole defects were present). The arriving monomer has a greater probability to react with any $Fe^{3+}$ present at the surface compared to diffusion of the monomer past this to $Fe^{3+}$ residing in the bulk of the oxidant layer. In a more detailed XPS analysis, the VPP process was terminated after, 5, 15 and 25 minutes. If the bottom-up growth mechanism is indeed correct, the ratio of fresh to spent oxidant should remain high as new oxidant is transferred from the lower oxidant "reservoir" to the topmost surface via capillary transport during PEDOT film growth. The results of the XPS investigation are shown in Table 1. As the polymerization of PEDOT progressed, the fraction of fresh oxidant at the topmost surface increased from the 5 minute to 15 minute mark and then remained constant (15 minute to 25 minute mark). Such a result, can only be reconciled for the proposed bottom-up film growth mechanism. The low $Fe^{3+}$ levels at the 5 minute mark can be rationalised by the fact that in the early stages of PEDOT film growth, the first layer has yet to form a tight granular bed and thus capillary transport of fresh oxidant to this layer is inhibited.

TABLE 1

The measured fraction of fresh ($Fe^{3+}$) and spent ($Fe^{2+}$) oxidant at the topmost (upper) surface of PEDOT films using XPS. In addition, the percentage of Fe relative to the major species of Fe, C, S and O examined in the XPS experiment is reported.

| Polymerization time (min) | % $Fe^{3+}$ | % $Fe^{2+}$ | % $Fe^0$ | Total % Fe |
|---|---|---|---|---|
| 5 | 0.0 | 42.4 | 57.6 | 0.4 |
| 15 | 15.2 | 64.0 | 20.8 | 3.2 |
| 25 | 14.4 | 64.6 | 21.0 | 3.3 |

It is hypothesized that the increased fraction of fresh oxidant (% $Fe^{3+}$) as well as the total oxidant (i.e. total % Fe) present at the topmost surface arises from the transport of liquid-like oxidant driven by capillary action. It is this oxidant that then reacts with the monomer to seed and grow subsequent layers of PEDOT.

Example 6

Effect of Alcohol Solvents on Conductivity

PEDOT polymers were formed according to Example 1 in the presence of a range of alcohol solvents as listed in Table 2.

TABLE 2

Conductivity of PEDOT films formed in the presence of various solvents and PEG-PPG-PEG polymers of mw 1900, 2900, 4400 and 5800.

| Solvent | Pvap solution | Kinematic viscosity of blend | Dielectric Constant | Conductivity | | | | StDev | | | |
|---|---|---|---|---|---|---|---|---|---|---|---|
| | | | | 1900 | 2900 | 4400 | 5800 | 1900 | 2900 | 4400 | 5800 |
| MeOH | 240.72 | 0.94 | 33 | 1343.95 | 1427.72 | 1141.40 | 2278.21 | 91.99 | 83.67 | 162.18 | 308.23 |
| EtOH | 113.32 | 1.72 | 24.5 | 1211.31 | 1639.38 | 1106.79 | 3391.90 | 87.02 | 105.18 | 70.31 | 271.51 |
| nPrOH | 42.32 | 2.64 | 20 | 1308.55 | 1456.15 | 1129.58 | 3060.92 | 102.71 | 104.59 | 101.90 | 369.85 |
| nBuOH | 18.28 | 3.23 | 18 | 1320.70 | 1459.89 | 1224.19 | 2523.17 | 103.79 | 82.03 | 77.68 | 270.96 |
| nHeOH | 7.82 | 4.74 | 13.3 | 1289.09 | 1378.04 | 1228.31 | 2585.19 | 63.98 | 42.26 | 86.88 | 142.46 |
| nOcOH | 7.70 | 6.59 | 10.3 | 1076.53 | 1232.03 | 1287.68 | 1471.38 | 51.72 | 45.02 | 40.85 | 45.31 |

The data show that the highest conductivity PEDOT films are formed in the presence of ethanol (EtOH) and n-propanol (nPrOH) and PEG-PPG-PEG (mw 5800). We suggest that as the viscosity of the solvent increases so does the viscosity or fluidity of the oxidant layer.

Example 7

Characterisation of Conductive Polymer Layers

Figure 2:
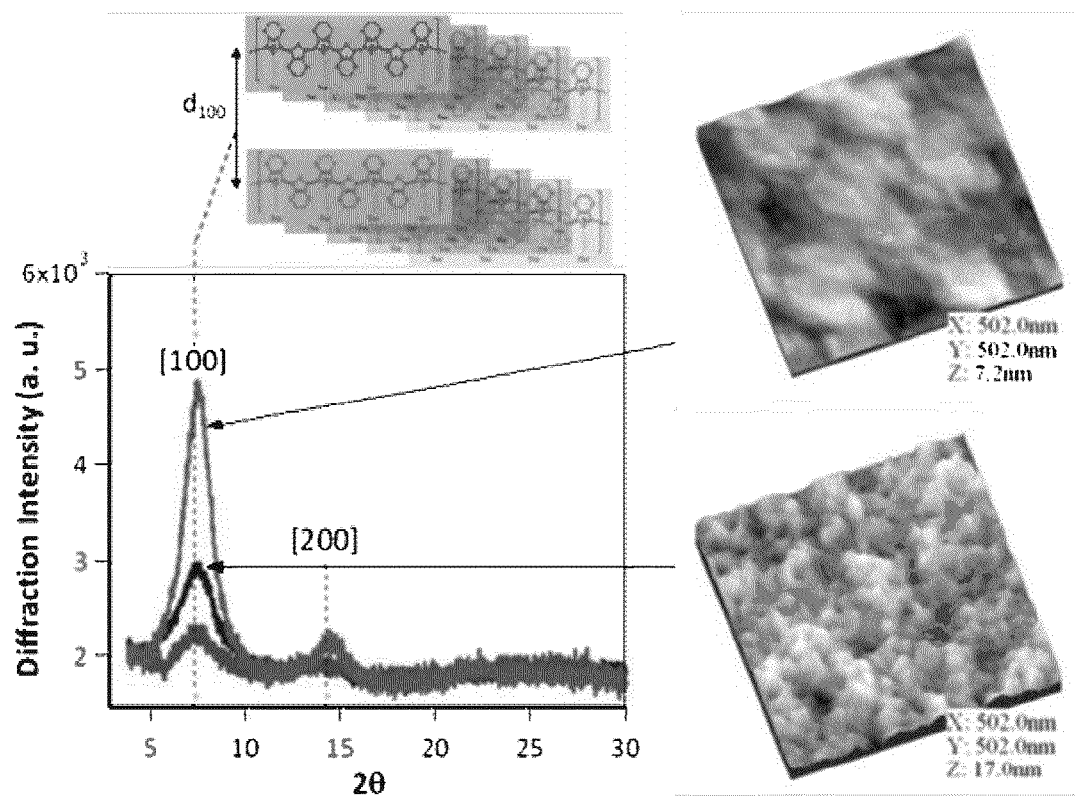
FIG. 2 shows XRD and AFM X-ray Diffraction (XRD) images showing the [100] and [200] peaks for: red) No PEG-PPG-PEG addition; blue) 2900 MW PEG-PPG-PEG addition and; green) 5800 MW PEG-PPG-PEG addition. The intensity of the [100] peak is a measure of how much of the polymer is aligned. This alignment is within any one polymer grain. The highest peak is observed for the PEDOT formed with 5800 MW PEG-PPG-PEG addition (green trace). The blue trace is PEDOT formed with the addition of 2900 MW PEG-PPG-PEG. The red trace is for PEDOT formed without PEG-PPG-PEG. Also note that there is a pronounced [200] peak for the green trace compared to its virtual absence for the red and blue traces. This is an indication that the next layer down also retains good alignment with respect to the top two layers of the PEDOT film. The peak located at [100] has an angle of 7.38° which represents a spacing of 13.91 Å between the polymer chains. This spacing remains constant regardless of whether the 2900 MW or 5800 MW PEG-PPG-PEG additive is used, or whether it is omitted. The figures on the right hand side of the figure are Atomic Force Microscopy (AFM) images of PEDOT films. Note that the top image has a flat, lamellar appearance. The bottom image has more of a "cauliflower" appearance.

X-Ray Diffraction (XRD) data was obtained for a PEDOT film formed on a silicon wafer. A silicon wafer substrate was used to avoid unwanted diffraction peaks from the substrate as the silicon wafer which does not have any interference peaks in the region of interest. The PEDOT films were grown on silicon wafers and these was placed into an XRD instrument. The data is shown in FIG. 2. The PEDOT grows as shown in the cartoon representation (top LHS). The d[100] represents the spacing between the polymer chains in the vertical direction off the surface of the substrate. A larger [100] peak implies that a far greater amount of the individual PEDOT polymer chains are aligned with respect to each other in this vertical direction. The smallest peak was for a PEDOT sample growth without any PEG-PPG-PEG. The next peak was for the 2900 mw PEG-PPG-PEG. The largest peak was for PEDOT grown with 5800 PEG-PPG-PEG. For the 5800 mw PEG-PPG-PEG there is also a significant [200] peak which means the next PEDOT layer down in the vertical direction is still well aligned. This suggests that the layers are well aligned over several layers. The peak location at 7.31° (corresponds to a spacing of 13.91 Å) does not change regardless of whether no PEG-PPG-PEG or PEG-PPG-PEG of different molecular weights are used. We also found that the d[010] spacing (which is the spacing between polymer chains going horizontally into the page) does not change (data not provided). This spacing gave a constant 3.45 Å.

The images on the tight hand side of FIG. 2 were taken using Atomic Force Microscopy (AFM) to probe the morphology of the PEDOT film. The bottom image shows the typical cauliflower morphology that it typically obtained for PEDOT films. It is characterised by a relatively smaller [100] peak as the polymer chains are not as well aligned. The top image shows the lamellar morphology and has a higher [100] peak.

Figure 3:
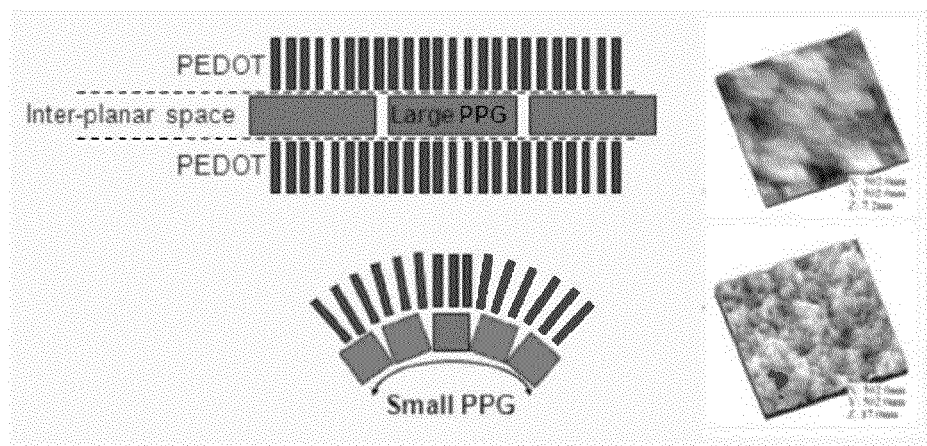
FIG. 3 is a schematic showing the proposed location of the PEG-PPG-PEG triblock copolymer. The copolymer resides in the [100] spacing between the PEDOT chains and is positioned along the [010] direction. The larger molecular weight 5800 PEG-PPG-PEG produces a stiffer lamellar structure. The smaller 2900 MW PEG-PPG-PEG allows a less rigid structure, producing the well known cauliflower structure.

A representation of our proposal for the morphology changes from cauliflower to lamellar is shown in FIG. 3. From X-ray photoelectron spectroscopy we know that the PEG-PPG-PEG remains in the PEDOT. We see no phase image difference using AFM, (i.e. the PEDOT looks homogeneous with no material phase segregation). XRD shows that the [100] and [010] spacing does not change, so by a process of elimination the PEG-PPG-PEG must reside as drawn. A larger PEG-PPG-PEG results in a larger amount of the PEDOT chains being aligned and transforms the morphology from cauliflower to lamellar.

Figure 4:
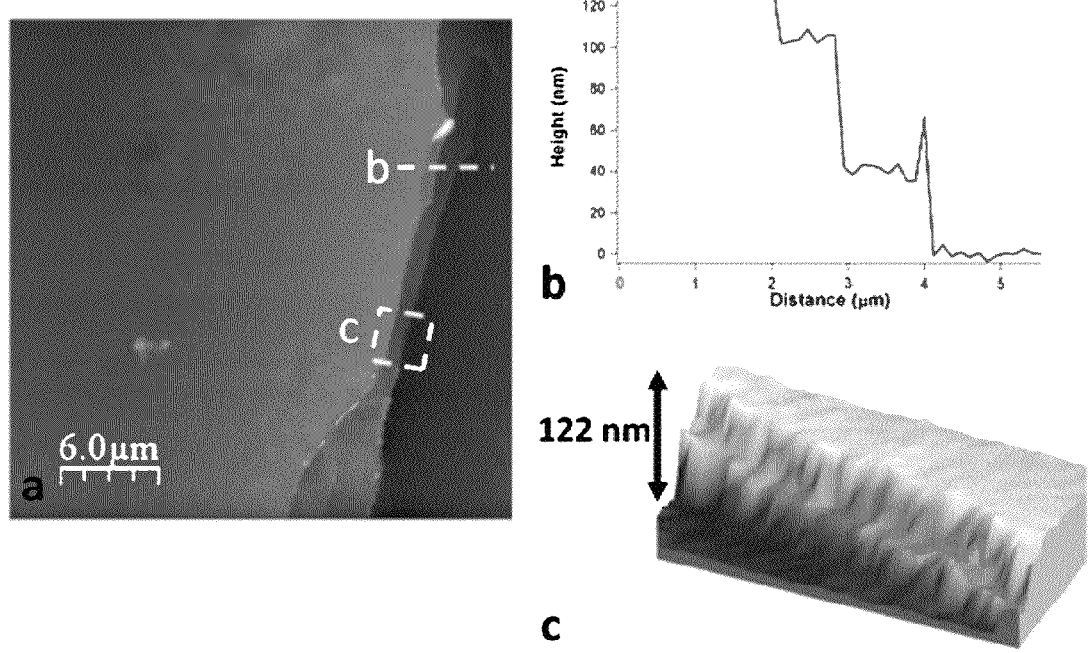
FIG. 4(a) shows an AFM image of a PEDOT film formed with 5800 MW PEG-PPG-PEG. It has been scored (RHS) with a soft scalpel revealing its lamellar sheet formation.
FIG. 4(b) shows an AFM raster across the scored polymer. It shows the steps of the sheet like morphology. Note that each step does not represent a single layer of the polymer. Each step would encompass many individual polymer layers. The step is just an indication of where the polymer has been torn.
FIG. 4(c) shows the overall PEDOT film thickness and lamellar step like morphology.

A PEDOT sample was then scratched with a scalpel and the edge of the scratch, PEDOT/no PEDOT was examined using atomic force microscopy (AFM) (see FIG. 4). The scratched PEDOT tore in a sheet like fashion which highlights the lamellar like morphology. This is evident in both the RH images which show "steps" in the PEDOT. These steps are on a lot larger length scale than the molecular spacing shown in FIG. 2.

Example 8

Characterisation of Oxidant Layer

Figure 5:
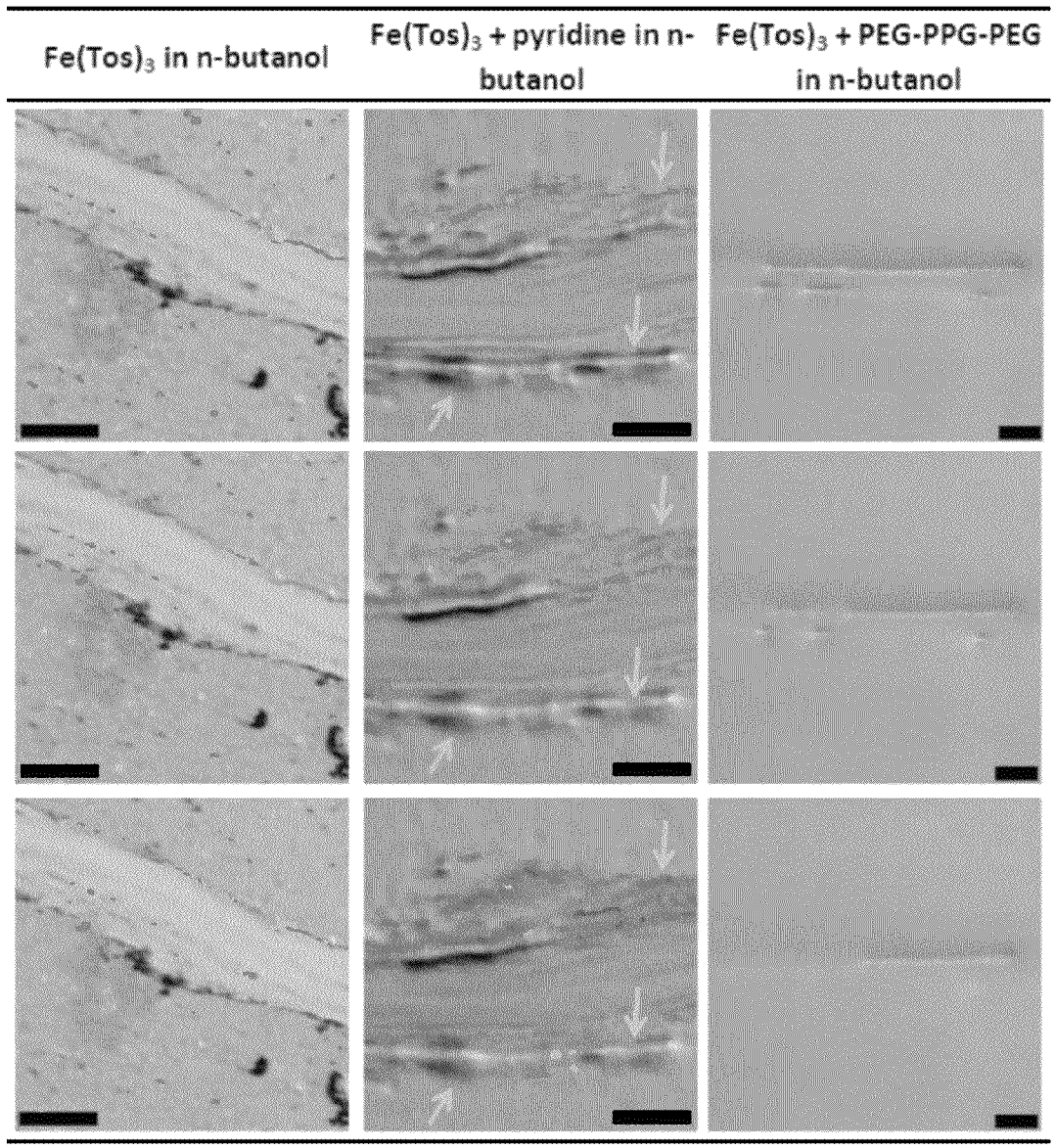
FIG. 5 shows time lapse images obtained using an optical microscope of scratches made in the oxidant thin films after being heated to 70° C. for 30 seconds, then placed into the VPP chamber and pumped down to 10 mbar at 35° C. In each sequence the interval between successive images is 2 minutes. Note that the score in the oxidant layer for the LHS image does not change, indicating that the oxidant layer is solid like. The middle image shows a slight relaxation of the score, highlighted by yellow arrows. The RHS image shows the score being back filled with time, an indication that this oxidant layer is liquid-like. The black scale bar represents 50 μm.

Various oxidant solutions were spin-coated at 1500 rpm onto glass microscope slides. Time lapse images (two minutes between snapshots) of the oxidant surface were then taken using an optical microscope fitted with a digital camera. Scratches were made in the oxidant layers using a scalpel. The images are shown in FIG. 5. The LH image shows no relaxation of the oxidant layer. The middle image shows the oxidant layer relaxing, highlighted by arrows. The RH image shows the scratch self "healing" as the oxidant flows into the scratch region.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

All publications mentioned in this specification are herein incorporated by reference. Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed in Australia or elsewhere before the priority date of each claim of this application.

The invention claimed is:

1. A process for producing a conductive polymer, the process comprising: providing a substrate having an oxidant layer on a surface thereof, the oxidant layer containing an oxidant, a solvent or blend of solvents, and a high molecular weight non-ionic surfactant; wherein the oxidant layer containing an oxidant comprises a hydrated metal ion and the high molecular weight non-ionic surfactant is capable of binding to the metal ion of the oxidant to release bound water from the oxidant and is an ABA or a BAB type triblock copolymer wherein the A block comprises a polymer composed of hydrophilic units and the B block comprises a polymer composed of hydrophobic units; exposing the surface containing the oxidant layer to a vapour containing an aryl or heteroaryl monomer that is polymerisable to form a conductive polymer without exposing the oxidant layer to an external source of water vapour; and polymerising the aryl or heteroaryl monomer to form a polyaryl or polyheteroaryl conductive polymer on the surface of the substrate.

2. The process according to claim 1, wherein the oxidant layer further comprises a low molecular weight non-ionic or ionic hydrotrope.

3. The process according to claim 1, wherein the molecular weight of the high molecular weight non-ionic surfactant is equal to or greater than about 1000.

4. The process according to claim 1, wherein the high molecular weight non-ionic surfactant is a triblock copolymer wherein the A block comprises a polymer composed of ethylene glycol units and the B block comprises a polymer composed of alkylene glycol units having 3 to 10 carbon atoms in the alkylene moiety of each unit.

5. The process according to claim 4, wherein the triblock copolymer is selected from the group consisting of: a poly(ethylene glycol)-poly(propylene glycol)-poly(ethylene glycol) (PEG-PPG-PEG) triblock polymer and a poly(propylene glycol)-poly(ethylene glycol)-poly(propylene glycol) (PPG-PEG-PPG) triblock polymer.

6. The process according to claim 2, wherein the low molecular weight non-ionic or ionic hydrotrope has a molecular weight of equal to or less than about 200.

7. The process according to claim 2, wherein the low molecular weight non-ionic or ionic hydrotrope is an alkylene glycol.

8. The process according to claim 7, wherein the low molecular weight non-ionic or ionic hydrotrope is selected from the group consisting of ethylene glycol, diethylene glycol, and triethylene glycol.

* * * * *